United States Patent
Kim et al.

(10) Patent No.: US 7,663,435 B2
(45) Date of Patent: Feb. 16, 2010

(54) DOHERTY AMPLIFYING APPARATUS USING A HARMONIC CONTROL CIRCUIT

(75) Inventors: Bumman Kim, Kyungsangbuk-do (KR); Jangheon Kim, Kyungsangbuk-do (KR); Young yun Woo, Kyungsangbuk-do (KR); Junghwan Moon, Kyungsangbuk-do (KR)

(73) Assignee: Postech Academy-Industry Foundation, Kyungsangbuk-Do (KR)

( * ) Notice: Subject to any disclaimer, the term of this patent is extended or adjusted under 35 U.S.C. 154(b) by 54 days.

(21) Appl. No.: 12/068,684

(22) Filed: Feb. 11, 2008

(65) Prior Publication Data

US 2008/0191801 A1    Aug. 14, 2008

(30) Foreign Application Priority Data

Feb. 14, 2007   (KR) ...................... 10-2007-0015324

(51) Int. Cl.
*H03F 3/68* (2006.01)
(52) U.S. Cl. .................................................. 330/124 R
(58) Field of Classification Search ............. 330/124 R, 330/295
See application file for complete search history.

(56) References Cited

U.S. PATENT DOCUMENTS

| | | | | |
|---|---|---|---|---|
| 5,420,541 | A * | 5/1995 | Upton et al. ................. | 330/286 |
| 6,861,907 | B2 * | 3/2005 | Gotou ......................... | 330/295 |
| 7,342,444 | B2 * | 3/2008 | Kim et al. ............... | 330/124 R |
| 2004/0056723 | A1 | 3/2004 | Gotou | |
| 2005/0231286 | A1 | 10/2005 | Gotou et al. | |

FOREIGN PATENT DOCUMENTS

| | | |
|---|---|---|
| WO | 2004/023646 | 3/2004 |
| WO | 2006/003608 | 1/2006 |

* cited by examiner

*Primary Examiner*—Steven J Mottola
(74) *Attorney, Agent, or Firm*—Bacon & Thomas, PLLC

(57) ABSTRACT

A Doherty power amplifying apparatus includes a harmonic-controlled Doherty amplifier; and an input matching unit and an output matching unit for input matching and output matching the harmonic-controlled Doherty amplifier, respectively. The harmonic-controlled Doherty amplifier includes a carrier amplifier; a peaking amplifier arranged in parallel to the carrier amplifier; and a harmonic control circuit, arranged in front of the output matching unit, for controlling a harmonic component of an output of the Doherty amplifier to enable the Doherty amplifier to perform a switching or saturation operation.

19 Claims, 11 Drawing Sheets

DOHERTY AMPLIFYING APPARATUS USING A HARMONIC CONTROL CIRCUIT

FIELD OF THE INVENTION

The present invention relates to a high efficiency and linearity power amplifying apparatus; and, more particularly, to a power amplifying apparatus using a harmonic control circuit, capable of achieving a high efficiency power amplification by having a microwave Doherty amplifier for performing a switching and a saturation operation.

BACKGROUND OF THE INVENTION

In general, a Doherty power amplifier has a structure of a carrier and a peaking amplifier connected in parallel by using a quarter-wave transformer ($\lambda/4$ line). Further, the Doherty amplifier is driven by a method in which the peaking amplifier controls a load impedance of the carrier amplifier by increasing the amount of current supplied to the load from the peaking amplifier as the power level is increased, thereby improving efficiency.

A microwave Doherty amplifier was first proposed by W. H. Doherty in 1936, and had initially been used in an amplitude modulation (AM) transmitter of a broadcasting apparatus using a high-power low-frequency (LF) vacuum tube or a medium frequency (MF) vacuum tube. Since then, there have been a variety of proposals for implementing the microwave Doherty amplifier with a solid-state device without using a vacuum tube, and numerous researches have been conducted to implement the proposals.

A Doherty amplifier employing an asymmetric power driving method has achieved high efficiency and linearity. Especially, the Doherty amplifier employed in base stations and handsets for mobile communications has been highly enhanced in performance. Such a Doherty amplifier for the high frequency range includes a power divider; a transmission line for synchronizing phases between a carrier amplifier and a peaking amplifier; the carrier amplifier and the peaking amplifier capable of outputting a maximum power by configuring the input matching circuits and the output matching circuits of the respective amplifiers such that the output level of the carrier amplifier is same as that of the peaking amplifier; an offset line for generating a proper load modulation by increasing an impedance output while the peaking amplifier is not operating; and quarter-wave transmission lines for performing the Doherty operation.

In this configuration, by sequentially providing the output matching circuits and, in turn, the offset line at output ends of transistors in the carrier amplifier and the peaking amplifier, an imaginary part as well as a real part can be matched, thereby enabling the Doherty operation while obtaining the maximum output power. (See Y. Yang et al, "Optimum Design for Linearity and Efficiency of Microwave Doherty Amplifier Using a New Load Matching Technique," Microwave Journal, Vol 44, No. 12, pp. 20-36, December 2002.)

Further, an N-way Doherty amplifier having an optimum design for efficiency and linearity while improving a typical Doherty amplifier was also studied (See, Y. Yang et al, "A Fully Matched N-way Doherty Amplifier with Optimized Linearity," *IEEE Trans. Microwave Theory and Tech.*, Vol. 51, No. 3, pp. 986-993, March 2003.)

Moreover, there is presented an N-stage Doherty amplifier for gradually achieving high efficiency from a much lower power level in comparison with a conventional Doherty amplifier (See N. Srirattana et al, "Analysis and design of a high efficiency multistage Doherty amplifier for WCDMA," EuMC Digest 2003, Vol. 3, pp. 1337-1340, October 2003.)

Further, in order to solve a problem in which the Doherty amplifier do not produce a maximum power output due to a low bias when the Doherty amplifier is implemented by using a solid-state device, there has been proposed a Doherty amplifier by using an envelope tracking device (See Y. Yang et al, "A Microwave Doherty Amplifier Employing Envelope Tracking Technique for High Efficiency and Linearity", IEEE Microwave and Wireless Components Letters, Vol. 13, No. 9, September 2003., and J. Cha et al, "An Adaptive Bias Controlled Power Amplifier with a Load-Modulated Combining Scheme for High Efficiency and Linearity", *IEEE MTT-S Int. Microwave Sympo*. Vol. 1, pp. 81-84, June 2003.)

However, even in the proposed Doherty amplifier, an additional device for controlling the power level of the peaking and the carrier power amplifiers is still required in order to achieve an improved linearity and the maximum output. To solve this problem, a research has been made about a Doherty power amplifier using an uneven power drive in which input powers are fed unevenly (J. Kim et al, "Optimum Operation of Asymmetrical-Cells-Based Linear Doherty Power Amplifiers-Uneven Power Drive and Power Matching," IEEE Trans. Microwave Theory Tech., Vol. 53, No. 5, pp. 1802-1809, May, 2005; J. Kim et al, "Advanced Design Methods of Doherty Amplifier for Wide Bandwidth, High Efficiency Base Station Power Amplifiers," 35th European Microwave Conference, Paris, France, pp. 963-966, October, 2005).

As discussed above, there have been developed various techniques for the Doherty power amplification. However, as base stations for mobile communications and terminal systems are being further reduced in size while there are increasing demands for saving the cost, a power amplification of a higher efficiency than the conventional Doherty power amplifiers is required.

SUMMARY OF THE INVENTION

It is, therefore, an object of the present invention to provide a high efficiency harmonic-controlled Doherty amplifying apparatus capable of enhancing the efficiency together with the linearity compared to the conventional Doherty amplifier or other types of high efficiency power amplifier.

It is another object of the present invention to provide a high efficiency Doherty amplifying apparatus using a harmonic control circuit, capable of performing a switching and a saturation operation by each of the power amplifiers included in the Doherty amplifying apparatus.

In accordance with a first aspect of the invention, there is provided a Doherty power amplifying apparatus, including a harmonic-controlled Doherty amplifier; and an input matching unit and an output matching unit for input matching and output matching the harmonic-controlled Doherty amplifier, respectively, wherein the harmonic-controlled Doherty amplifier includes a carrier amplifier; a peaking amplifier arranged in parallel to the carrier amplifier; and a harmonic control circuit, arranged in front of the output matching unit, for controlling a harmonic component of an output of the Doherty amplifier to enable the Doherty amplifier to perform a switching or saturation operation.

In accordance with a second aspect of the invention, there is provided a Doherty power amplifier, including a carrier amplifier and a plurality of peaking amplifiers, each of the carrier amplifier and the peaking amplifiers includes an input matching unit and an output matching unit; a N-way power divider for applying a same input power to the carrier amplifier and the peaking amplifiers; an offset line, connected to each of the output matching units of the carrier amplifier and the peaking amplifiers, for controlling a load impedance output when the peaking amplifiers are not operating; a first quarter-wave transmission line serving as an impedance inverter for converting an impedance output provided by the offset line into a ¼ wavelength to enable a Doherty amplification; a second quarter-wave transmission line for converting an impedance output provided by the offset line into a ¼ wavelength to set a load impedance of the Doherty amplifier; and a harmonic control circuit for controlling a harmonic component in an output of the carrier amplifier and the peaking amplifiers to enable the Doherty amplifier to perform a switching or saturation operation.

In accordance with a third aspect of the invention, there is provided a Doherty power amplifier, comprising: a carrier amplifier and a plurality of peaking amplifiers, each of the carrier amplifier and the peaking amplifiers includes an input matching unit and an output matching unit; a N-stage power divider for applying a same input power to the carrier amplifier and the peaking amplifiers; an offset line, connected to each of the output matching units of the carrier amplifier and the peaking amplifiers, for controlling a load impedance output when the peaking amplifiers are not operating; a first quarter-wave transmission line serving as an impedance inverter for converting an impedance output provided by the offset line into a ¼ wavelength to enable a Doherty amplification; a second quarter-wave transmission line for converting an impedance output provided by the offset line into a ¼ wavelength to set a load impedance of the Doherty amplifier; and a harmonic control circuit for controlling a harmonic component in an output of the carrier amplifier and the peaking amplifiers to enable the Doherty amplifier to perform a switching or saturation operation.

In accordance with the present invention, the efficiency can be enhanced compared to the conventional Doherty amplifier or other kinds of power amplifiers while achieving a better linearity than the conventional switching or saturation power amplifier. Therefore, by applying the present invention to a mobile communications network or power amplifier for use in the next-generation base stations or mobile terminals, the efficiency can be improved while achieving a high linearity. In this manner, the cost can be reduced while the reliability can be enhanced.

Further, since the present invention has a simple configuration, and is easy to apply to commercial structures, it is highly practical as well.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE EMBODIMENT

Hereinafter, embodiments of the present invention will be described in detail with reference to the accompanying drawings.

Figure 1:
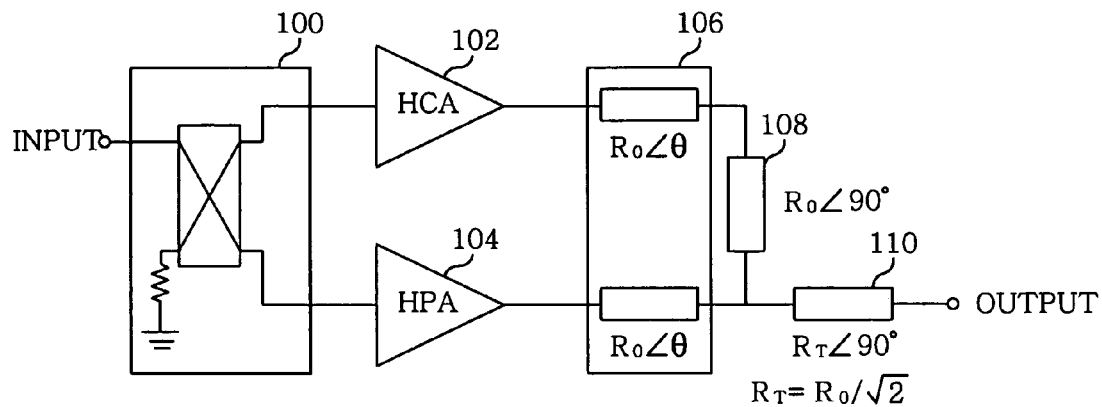
FIG. 1 is a configuration diagram of a 2-way Doherty power amplifying apparatus.

FIG. 1 is a configuration diagram of a 2-way power amplifying apparatus using a harmonic control circuit. The power amplifying apparatus shown therein includes a power divider 100, a carrier amplifier 102, a peaking amplifier 104, an offset line 106, a first quarter-wave transmission line 108 and a second quarter-wave transmission line 110. In accordance with the present invention, the carrier amplifier 102 is a harmonic-controlled carrier amplifier (HCA), and the peaking amplifier 104 is a harmonic-controlled peaking amplifier (HPA).

In accordance with the present invention, a harmonic control is performed on the carrier amplifier 102 and the peaking amplifier 104 by using a harmonic control circuit, so that a switching operation or a saturation operation is carried out.

Therefore, the Doherty power amplifying apparatus has power amplification characteristics of a higher efficiency than that of the conventional power amplifying apparatus. Power amplifiers capable of performing the switching operation or the saturation operation include the following types: class D, class E, class F, class G, class H, class I, class J, class S, class E/F series (e.g., class E/F$_3$, class E/F$_{2,5}$, class E/F$_{odd}$, class E/F$_{3,odd}$), class J/E, inverse class D and inverse class F. In accordance with the present invention, the above-listed types of power amplifiers may be used to perform the harmonic control on the conventional Doherty power amplifier. Thus, a power amplifier in accordance with the present invention includes the power amplifier capable of performing the switching operation or the saturation operation further to, e.g., the power amplifying apparatus shown in FIG. 1.

The power divider 100 synchronizes the phases of the carrier amplifier and the peaking amplifier by using a hybrid coupler. The offset line 106 permits to occur a proper load modulation by increasing impedance output while the peaking amplifier 104 is not operating.

The first quarter-wave transmission line 108 serves as an impedance inverter, thereby implementing the Doherty operation. For example, the first quarter-wave transmission line 110 reverses an output, e.g., from R$_O$/2 to 2R$_O$, where R$_o$ denotes load impedance. The second quarter-wave transmission line 110 changes load impedance, e.g., from 50 Ohm to 25 Ohm. In this case, since the power amplifying apparatus is formed by connecting a single carrier amplifier 102 and a (N−1)-number of peaking amplifiers 506 in parallel, the load impedance thereof should be made to have R$_O$/N with respect to a characteristic impedance of 50 Ohm. For example, FIG. 1 shows the 2-way power amplifying apparatus (i.e., N=2) and, therefore, there should be provided the second quarter-wave transmission line 110 for changing the load impedance from 50 Ohm to 25 Ohm, wherein the characteristic impedance of the second quarter-wave transmission line 110 can be expressed as $\sqrt{(50 \times 25)}$ Ohm.

As described above, the power amplifier shown in FIG. 1, which may further include the harmonic control circuit in accordance with the present invention, has a configuration in which the carrier amplifier 102 and the peaking amplifiers 104 are arranged in parallel. In this case, output ends of the two amplifiers 102 and 104 are implemented through a Doherty network composed of the offset line 106 and a quarter-wave transformer (λ/4 line) with the first and the second quarter-wave transmission lines 108 and 110.

Figure 2:
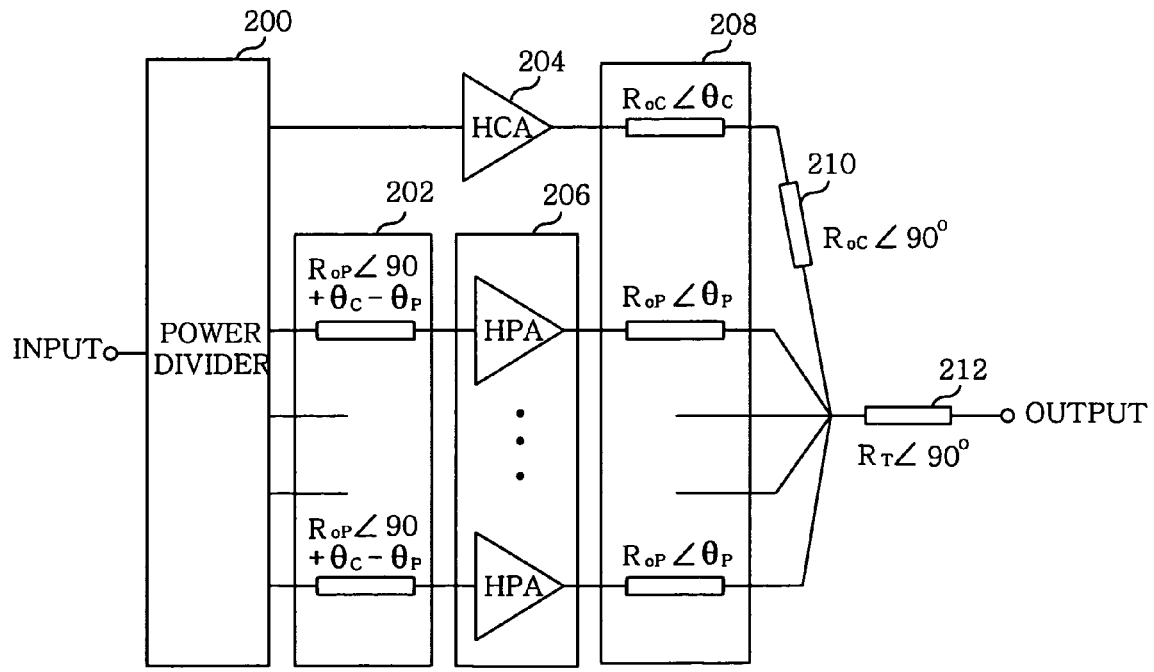
FIG. 2 is a configuration diagram of an N-way Doherty power amplifying apparatus.
Figure 3:
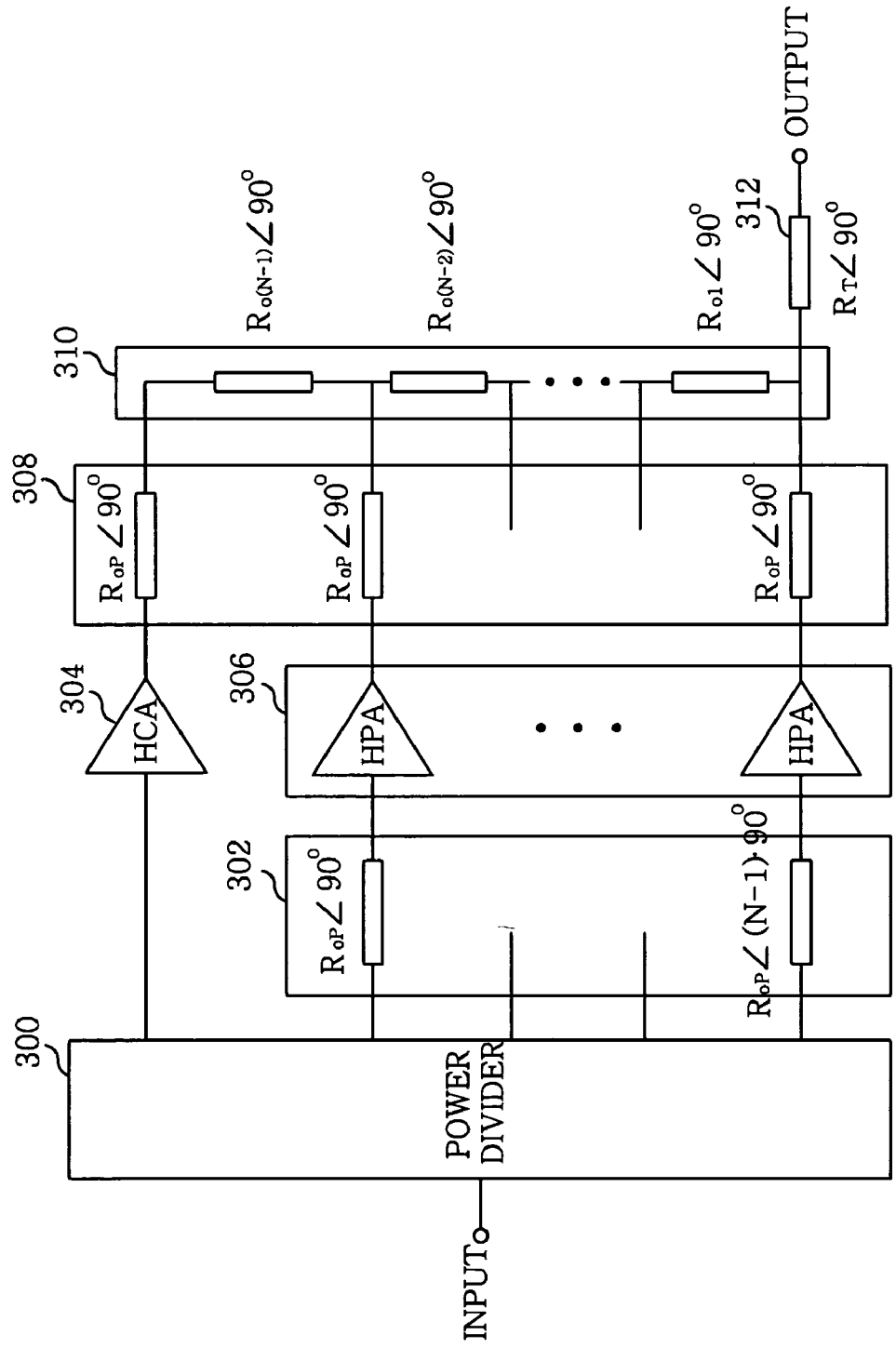
FIG. 3 is a configuration diagram of an N-stage Doherty power amplifying apparatus.

FIG. 2 illustrates an N-way (where N is an integer equal to or greater than 2) power amplifying apparatus in accordance with another preferred embodiment of the present invention. The N-way Power amplifying apparatus includes an N-way power divider 200, a carrier amplifier 204, a peaking amplifier 206, a transmission line 202 for synchronizing the phases of the carrier amplifier 204 and the peaking amplifier 206, an offset line 206 and quarter-wave transmission lines 210 and 212. Herein, in case of performing the harmonic control on the carrier amplifier 204 and the peaking amplifier 206 in accordance with the present invention, the carrier amplifier 204 and the peaking amplifier 206 may include power amplifiers capable of a switching operation or a saturation operation.

In accordance with the present invention, the Doherty amplifying apparatus is configured such that harmonic control circuits are respectively connected to output ends of the carrier amplifier and the peaking amplifier, and offset lines are connected thereto for changing an output of the load impedance when the peaking amplifier is not operating. The Doherty amplifying apparatus in accordance with the present invention further includes a quarter-wave transmission line serving as an impedance inverter for Doherty power amplification, and another quarter-wave transmission line for setting the load impedance.

Figure 4:
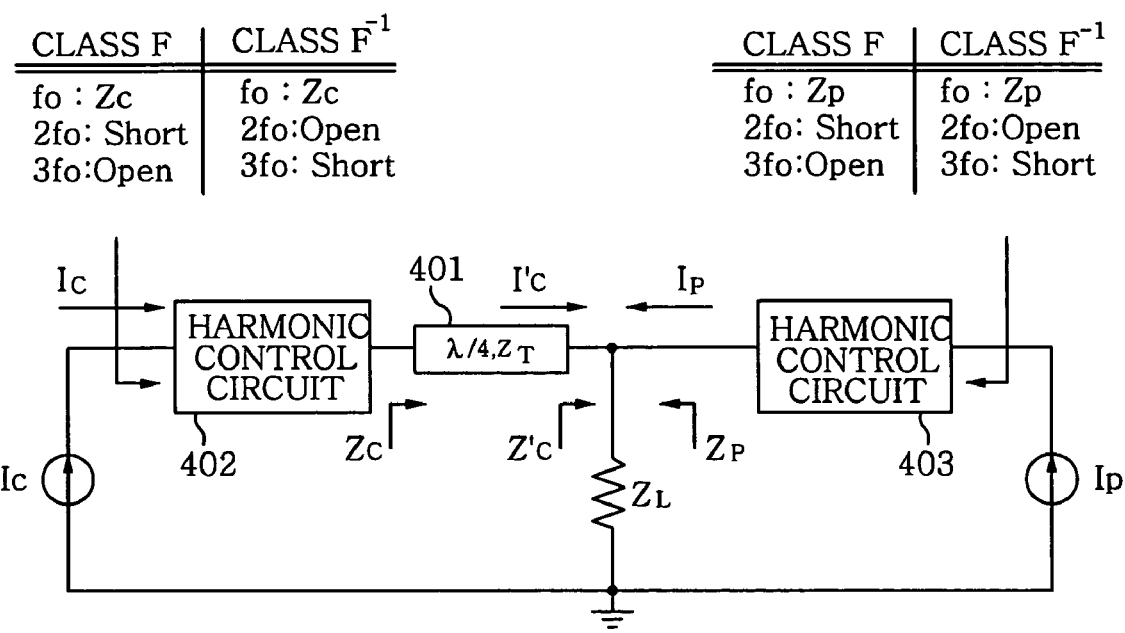
FIG. 4 is a conceptual diagram for explaining the harmonic-controlled Doherty power amplifying apparatus in accordance with the present invention.

FIG. 4 is a conceptual diagram for explaining operation principles of a harmonic-controlled power amplifier using the harmonic control circuit in accordance with the present invention.

In FIG. 4, the harmonic-controlled carrier amplifier includes a carrier amplifier represented as a carrier current source (Ic), and a harmonic control circuit 402. Further, the harmonic-controlled peaking amplifier includes a peaking amplifier represented as a peaking current source (Ip), and a harmonic control circuit 403. A first quarter-wave transmission line 401 is connected to an output end of the harmonic control circuit 402 at a downstream side of the carrier current source Ic. The harmonic-controlled carrier and peaking amplifiers are configured with, for example, class-F or inverse class-F saturation amplifiers, and perform a saturation operation by a harmonic control using the harmonic control circuits 402 and 403. Further, under the harmonic control using the harmonic control circuits 402 and 403, the harmonic-controlled carrier and peaking amplifiers perform a conventional Doherty operation for the fundamental frequency component $f_0$, and adjust the impedance for the second and third harmonic components whose frequencies are two and three times of the fundamental frequency, thereby achieving high efficient characteristics. That is, the harmonic control circuits 402 and 403 control harmonic components, and perform the harmonic control by passive elements or microstrip lines such as the first quarter-wave transmission line 401. Thus, in case of a class-F saturation power amplifier, the waveform of a half-sine wave and a square wave are shown at the maximum output level; and, in case of an inverse class-F saturation power amplifier, the waveform of a square wave and a half-sine wave are shown at the maximum output level. Further, the bias for the peaking amplifier is set to be lower than that for the carrier amplifier to achieve the Doherty amplification characteristics.

Figure 5A:
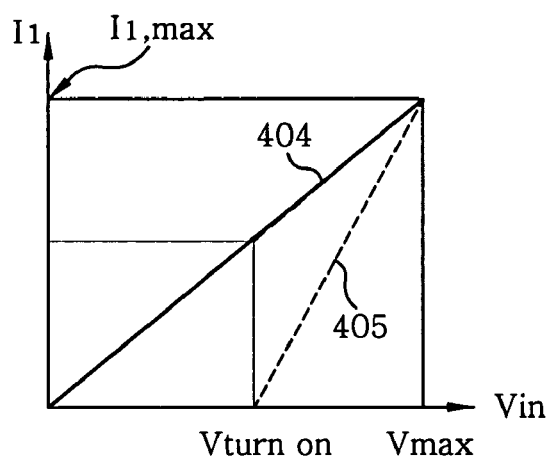
FIGS. 5A and 5B are graphs respectively showing the fundamental current component and the fundamental voltage component depending on the input voltage in the Doherty power amplifying apparatus in accordance with the present invention.
Figure 5B:
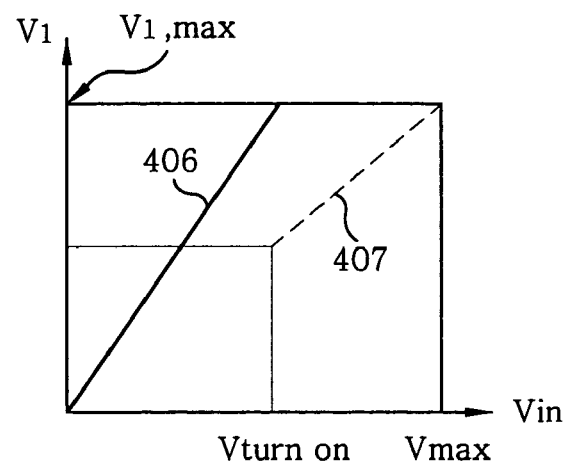

FIGS. 5A and 5B are graphs respectively showing the fundamental current component and the fundamental voltage component depending on the input voltage in the Doherty power amplifying apparatus in accordance with the present invention.

In FIG. 5A, the fundamental current Ic of the carrier amplifier is designated by a solid line 404, and the fundamental current Ip of the peaking amplifier is designated by a dotted line 405. Further, the fundamental voltage Vc of the carrier amplifier is designated by a solid line 406, and the fundamental voltage Vp of the peaking amplifier is designated by a dotted line 407. These relations can be expressed by the following equations:

$$I_C = I_{1,\max}\left(\frac{v_{in}}{V_{\max}}\right), \quad 0 < v_{in} < V_{\max} \quad \text{(Equation 1)}$$

$$I_P = \begin{cases} 0, & 0 < v_{in} < V_{turn\ on} \\ I_{1,\max}\left(\frac{v_{in} - V_{turn\ on}}{V_{\max} - V_{turn\ on}}\right), & V_{turn\ on} < v_{in} < V_{\max} \end{cases}$$

-continued $$V_C = \begin{cases} V_{1,max}\left(\dfrac{v_{in}}{V_{turn\ on}}\right), & 0 < v_{in} < V_{turn\ on} \\ V_{1,max}, & V_{turn\ on} < v_{in} < V_{max} \end{cases} \quad \text{(Equation 2)}$$

$$V_P = \begin{cases} 0, & 0 < v_{in} < V_{turn\ on} \\ V_{1,max}\left(\dfrac{v_{in}}{V_{max}}\right), & V_{turn\ on} < v_{in} < V_{max} \end{cases}$$

Figure 6A:
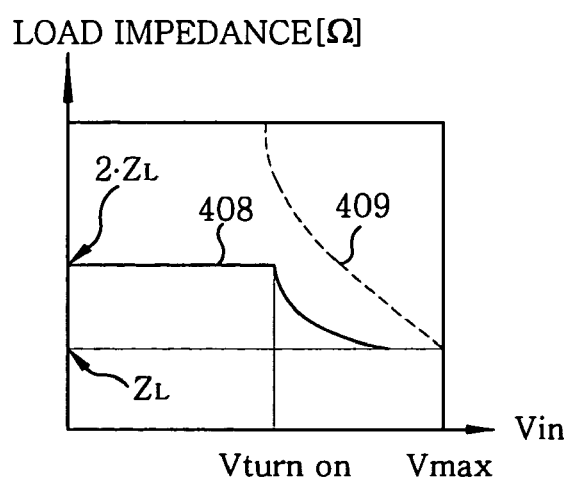
FIGS. 6A and 6B are graphs respectively showing the load impedance and the efficiency depending on the input voltage in the Doherty power amplifying apparatus in accordance with the present invention.
Figure 6B:
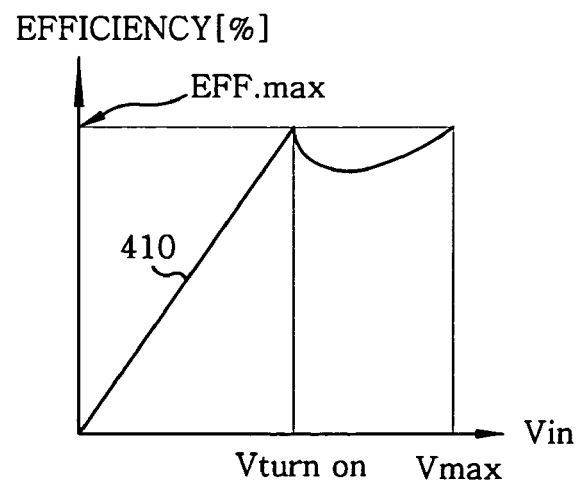

FIGS. 6A and 6B are graphs respectively showing the load impedance and the efficiency depending on the input voltage in the Doherty power amplifying apparatus in accordance with the present invention.

In FIG. 6A, reference numeral 408 refers to the load impedance of the carrier amplifier, and 409 refers to the load impedance of the peaking amplifier. $Z_L$ is the load impedance of the Doherty amplifier. As shown therein, the load impedance of the carrier amplifier and that of the peaking amplifier vary depending on the input voltage. The Doherty amplifier shows the maximum efficiency 100% at an input voltage level $V_{turn\ on}$ where the peaking amplifier starts to turn on and the maximum input voltage level Vmax. This shows that very high efficiency characteristics can be achieved by using the harmonic-controlled carrier and peaking amplifiers in which the harmonic components are controlled and a switching operation and a saturation operation are carried out while the operations similar to those of the conventional Doherty amplifier are maintained. This can be explained by the following equation:

$$\eta = \dfrac{P_{RF}}{P_{DC}} \times 100\ [\%] \quad \text{(Equation 3)}$$

$$= \dfrac{1}{2} \cdot \dfrac{I_{1,max} V_{1,max}}{I_{DC} V_{DC}} \left(\dfrac{v_{in}}{V_{turn\ on}}\right) \times 100,\ 0 < v_{in} < V_{max}$$

$$\eta = \dfrac{P_{RF}}{P_{DC}} \times 100\ [\%]$$

$$= \dfrac{\dfrac{1}{2} I_{1,max} V_{1,max} \left(\dfrac{v_{in}}{V_{max}}\right)\left(1 + \dfrac{v_{in} - V_{turn\ on}}{V_{max} - V_{turn\ on}}\right)}{I_{DC} V_{DC} \left(\dfrac{v_{in}}{V_{max}} + \dfrac{v_{in} - V_{turn\ on}}{V_{max} - V_{turn\ on}}\right)} \times 100,$$

$$V_{turn\ on} < v_{in} < V_{max}$$

where $$I_{1,max} = \dfrac{1}{2} i_{peak}(\text{class } F), \dfrac{2}{\pi} i'_{peak}(\text{class } F^{-1})$$

$$V_{1,max} = \dfrac{4}{\pi} V_{DC}(\text{class } F), \dfrac{\pi}{2} V_{DC}(\text{class } F^{-1})$$

$$I_{DC} = \dfrac{1}{\pi} i_{peak}(\text{class } F), \dfrac{1}{2} i'_{peak}(\text{class } F^{-1})$$

In case of a class-F saturation power amplifier, the waveform of a half-sine wave and a square wave is shown at the maximum output level, the fundamental current component, the fundamental voltage component and the DC component are respectively expressed by $I_{1,max}$, $V_{1,max}$ and $I_{DC}$ in Equation 3. Herein, the maximum current value is i'$_{peak}$, and the applied DC voltage is $V_{DC}$. Likewise, in case of an inverse class-F saturation power amplifier, the waveform of a square wave and a half-sine wave is shown at the maximum output level, the fundamental current component, the fundamental voltage component and the DC component are respectively expressed by $I_{1,max}$, $V_{1,max}$ and $I_{DC}$ in Equation 3. Herein, the maximum current value is i'$_{peak}$, and the applied DC voltage is $V_{DC}$.

Figure 7A:
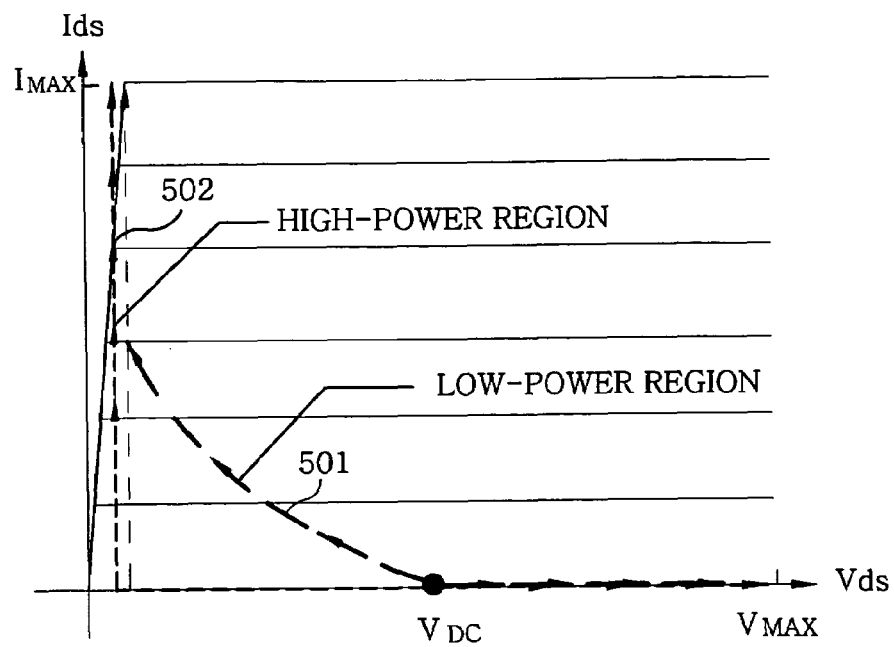
FIG. 7A is a graph for describing the load impedance of a harmonic-controlled carrier amplifier in view of load line in accordance with the present invention.

FIG. 7A is a graph for describing the load impedance of a harmonic-controlled carrier amplifier in view of load line in accordance with the present invention. Herein, the reference numeral 501 designates a load line in a low power range, and 502 designates a load line in a low power range.

As shown in FIG. 7A, in the harmonic-controlled power amplifier in accordance with the present invention, the harmonic-controlled peaking amplifier is off and the harmonic-controlled carrier amplifier is on in the low power range; and, the harmonic-controlled peaking amplifier and the harmonic-controlled carrier amplifier are on in the high power range.

At this time, the load line 501 follows an elliptical curve in an incompletely saturated state unlike a load line for the carrier amplifier in the conventional Doherty amplifier. Further, the overall efficiency is higher than that of the conventional Doherty amplifier. The load line 501 enters a completely saturated state at the voltage level $V_{turn\ on}$ where the harmonic-controlled peaking amplifier starts to turn on. At this time, the harmonic-controlled carrier amplifier achieves the maximum efficiency. Then, the load line 501 is changed to the load line 502 to follow an L-shaped curve in the high power range, where the waveform of current becomes greater.

Figure 7B:
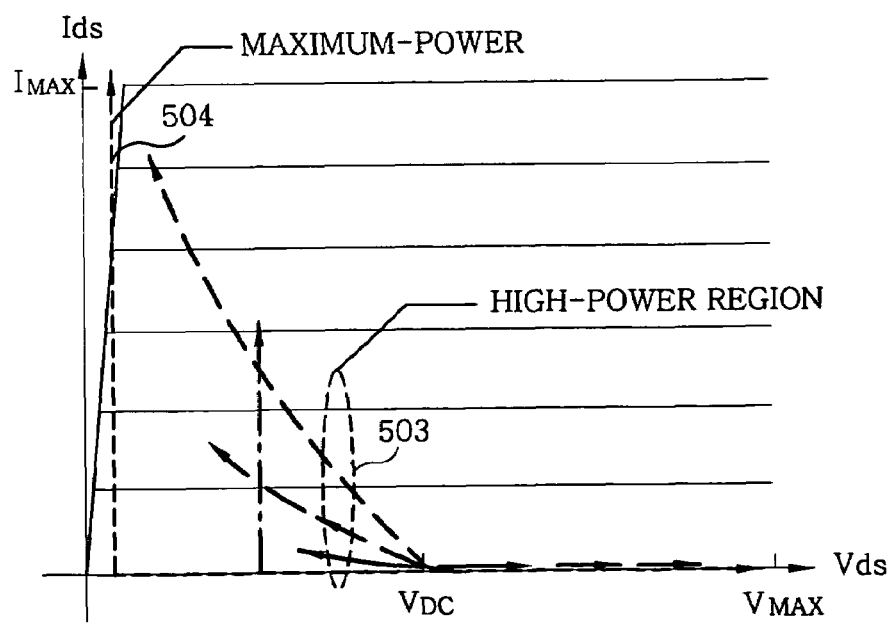
FIG. 7B is a graph for describing the load impedance of a harmonic-controlled peaking amplifier in view of load line in accordance with the present invention.

FIG. 7B is a graph for describing the load impedance of a harmonic-controlled peaking amplifier in view of load line in accordance with the present invention. Herein, the reference numeral 503 designates a load line in a low power range, and 504 designates a load line in a low power range.

As the harmonic-controlled peaking amplifier starts to turn on, the load impedance starts to decrease. Then, the load line 503 moves up in the entire high power range. At this time, the harmonic-controlled peaking amplifier enters an incompletely saturated state, and the load line follows an elliptical curve. At the moment when the maximum power, the harmonic-controlled peaking amplifier achieves the maximum efficiency together with the harmonic-controlled carrier amplifier, and the load line follows an L-shaped curve.

Figure 8:
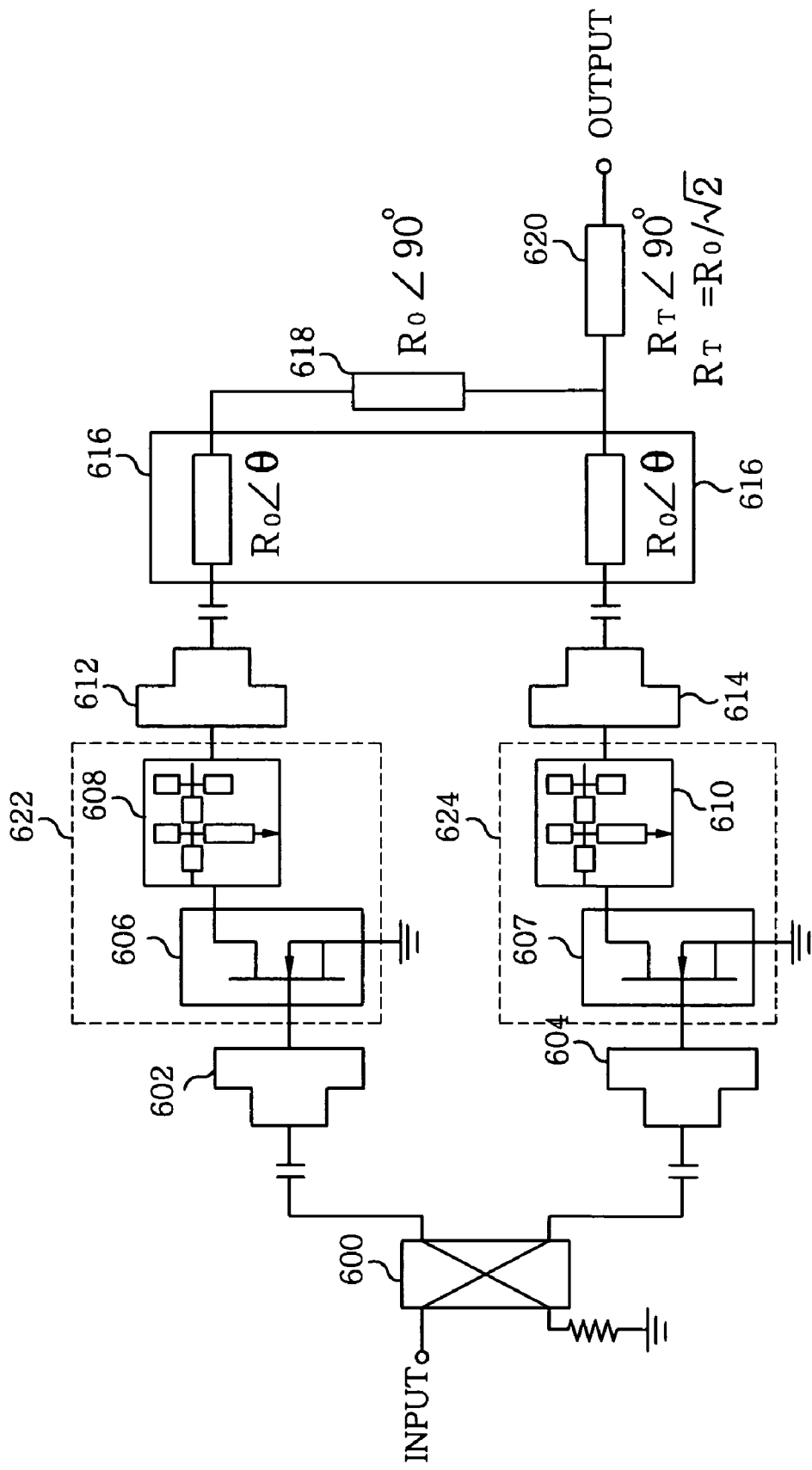
FIG. 8 is a configuration diagram of a 2-way Doherty power amplifying apparatus harmonic-controlled in inverse-F class in accordance with an embodiment of the present invention.

FIG. 8 is a configuration diagram of a 2-way Doherty power amplifying apparatus harmonic-controlled in inverse-F class in accordance with an embodiment of the present invention.

As shown therein, the harmonic-controlled Doherty power amplifying apparatus in accordance with the embodiment of the present invention includes a power divider 600, a harmonic-controlled carrier amplifier (HCA) 622, a harmonic-controlled peaking amplifier (HPA) 624, an offset line 616, a first quarter-wave transmission line 618, and a second quarter-wave transmission line 620.

The input end and the output end of the harmonic-controlled carrier amplifier 622 are respectively connected to the input matching circuit 602 and the output matching circuit 612, and the input end and the output end of the harmonic-controlled peaking amplifier 624 are respectively connected to the input matching circuit 602 and the output matching circuit 612.

The harmonic-controlled carrier amplifier 622 includes a carrier amplifier 606 and a harmonic control circuit 608, and the harmonic-controlled peaking amplifier 624 includes a peaking amplifier 607 and a harmonic control circuit 610.

The harmonic-controlled carrier amplifier 622 and the harmonic-controlled peaking amplifier 624 arranged in parallel thereto form a Doherty amplifier, and the input matching circuit and the output matching circuit for the harmonic-controlled carrier amplifier 622 are same as those for the harmonic-controlled peaking amplifier 624.

The harmonic-controlled carrier and peaking power amplifiers are implemented in the saturation amplifier structure or inverse class-F amplifier structure that can achieve high efficiency. The harmonic control circuits 608 and 610 operate such that the harmonic-controlled carrier and the peaking amplifiers output square waves and half-sine waves without, if possible, the waveforms of current and voltage do not have any overlapping region. Thus, the high-efficiency characteristics can be achieved.

Figure 9:
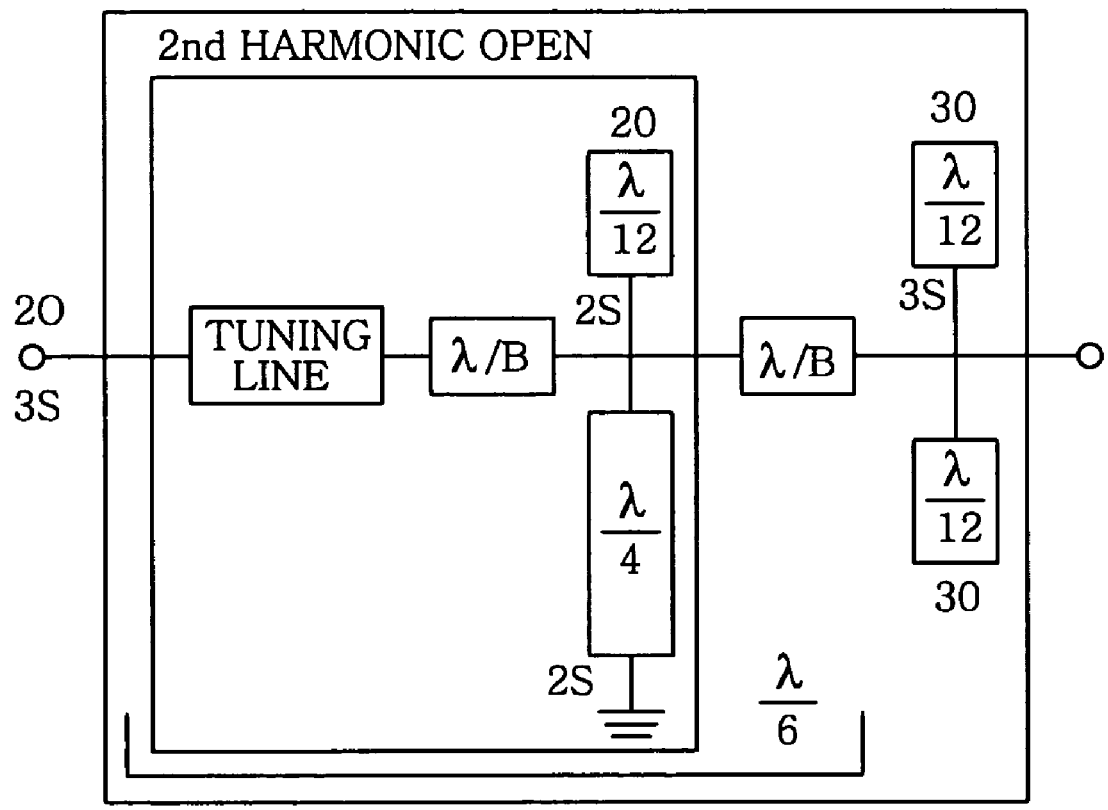
FIG. 9 is a configuration diagram of a harmonic control circuit for implementing the power amplifying apparatus shown in FIG. 8.

FIG. 9 is a diagram that shows the harmonic control circuit shown in FIG. 8 in view of impedance components.

The following description will be given by referring to FIG. 9 in view of FIG. 4. In order to open the impedance for the second harmonic component $2f_0$, the circuit is configured as follows. $\lambda/4$ line and $\lambda/12$ line are connected such that the impedance seen from that node appears to be shunt. Further, a $\lambda/8$ line and a tuning line are connected to compensate parasitic components of the device, so that the impedance seen from the current source appears to be open. Further, in order to shunt the impedance for the third harmonic component $3f_0$, a $\lambda/12$ line is connected such that the impedance seen from that node appears to be shunt, and the impedance seen from the current source appears to be shunt by connecting a $\lambda/6$ line in which the parasitic components are compensated.

Figure 10A:
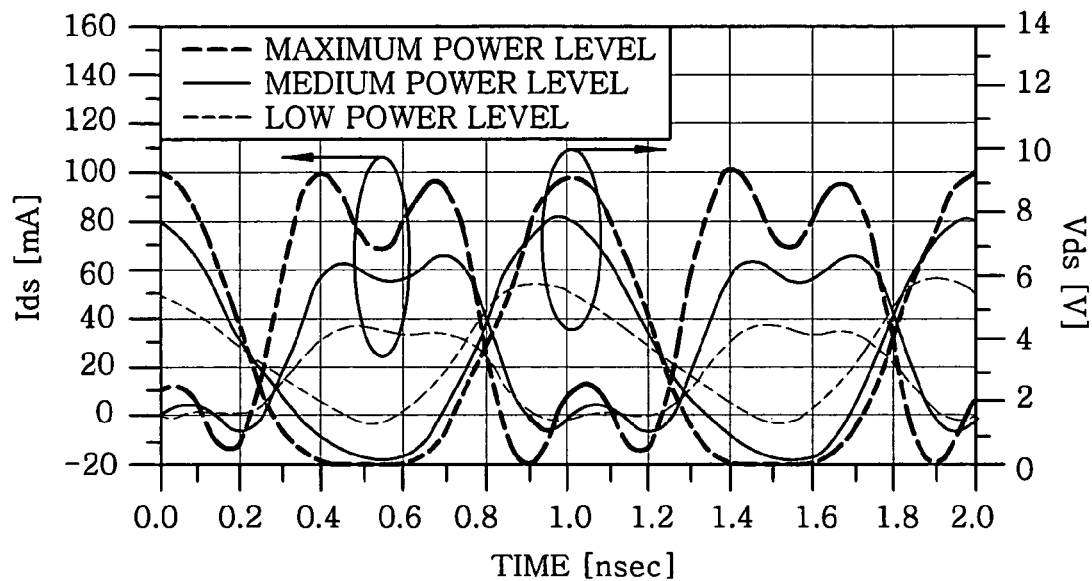
FIG. 10A is a simulation graph for comparing the waveforms of current and voltage of a carrier amplifier depending on different power levels in accordance with an embodiment of the present invention.

FIG. 10A shows a result of a simulation for verifying if the Doherty power amplifying apparatus configured as above operates with proper waveforms according to the power level. In this simulation, 0.1 W KGF1284 MESFET manufactured by OKI was selected as the carrier amplifier.

As shown in FIG. 10A, in a low power level designated by dashed lines, the waveforms of current and voltage do not exactly follow the square wave and half-since wave, and the amplifier is in an incompletely saturated state. Further, in a medium power level designated by solid lines and a maximum power level designated by double dotted lines, the waveforms of current and voltage follow an approximate square wave and an approximate half-sine wave, respectively.

Figure 10B:
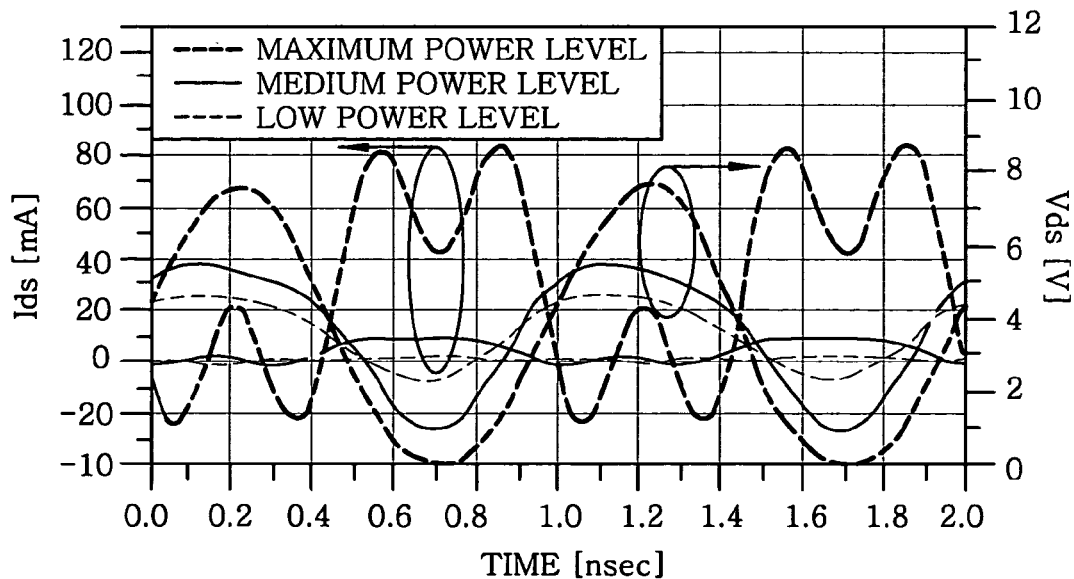
FIG. 10B is a simulation graph for comparing the waveforms of current and voltage of a peaking amplifier depending on different power levels in accordance with an embodiment of the present invention.

FIG. 10B is a graph showing the waveforms of current and voltage of the peaking amplifier in accordance with the simulation. As described above, in the low power level, the amplifier hardly operates, and, until the power level reaches its maximum, stays in an incompletely saturated state so that the waveforms of current and voltage do not follow the square wave and the half-sine wave. In this regard, it can be verified whether the operation is being properly performed by checking if the waveforms of current and voltage approximately follow the square wave and half-sine wave, respectively.

Figure 11A:
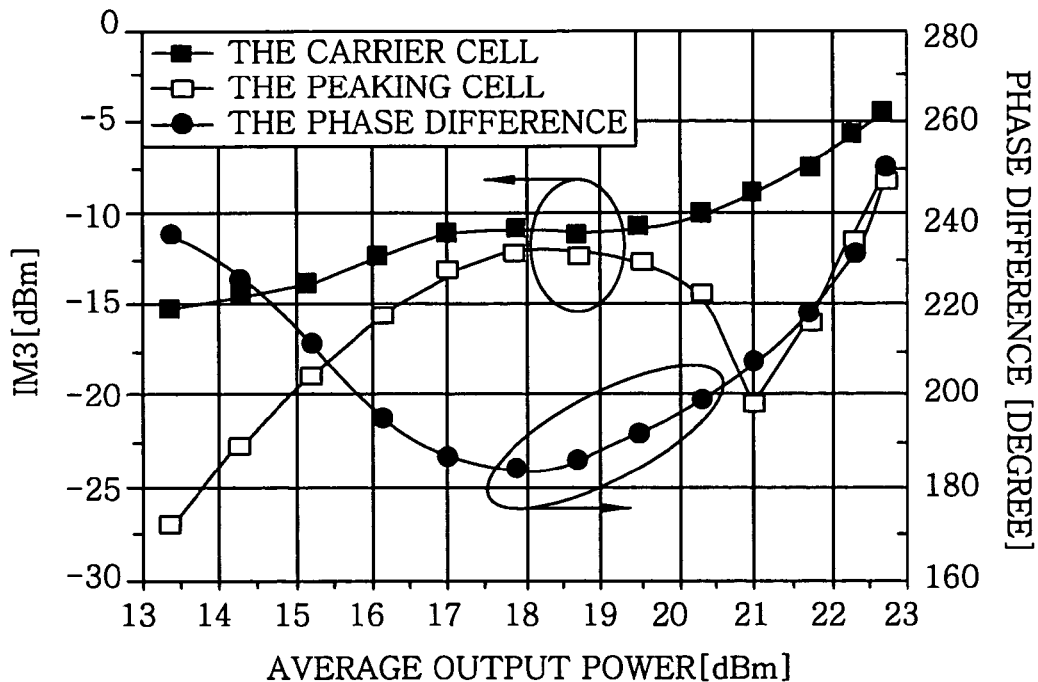
FIG. 11A is a two-tone simulation graph showing the IM3 level and the IM3 phase difference in the carrier amplifier and the peaking amplifier depending on the output power in accordance with the embodiment of the present invention.

FIG. 11A is a two-tone simulation graph showing the IM3 level and the IM3 phase difference in the carrier amplifier and the peaking amplifier depending on the output power. By a two-tone simulation, it was verified that the Doherty power amplifying apparatus of the present invention operates more linearly than a high-efficiency inverse class-F power amplifier.

For reference, IM3 denotes that an unknown signal is mixed with and then modulated together with two or more frequencies passing through a nonlinear system or a nonlinear circuit. Further, IMD refers to a distortion generated by such an inter-modulation. Especially, in case of the IM3 component, i.e., two-tone frequencies f1 and f2, although a signal having various hybrid components is outputted, multiple harmonics such as 2*f1, 3*f2 and so on can be removed by a filter. Since, however, third order harmonic frequencies overlapped with the f1 and the f2 signal, e.g., 2*f1−f2 and 2*f2−f1, cannot be removed even by the filter, they indicate an index of the linearity.

Moreover, the two-tone simulation indicates an analysis or a measurement performed by using two frequency components in a measuring device, a testing, a harmonic balance or the like. In case of measuring IMD and IM3, two-tone signals having offset frequencies (two-tone spacing) are introduced about a central frequency, to thereby analyze the IMD between the two signals, i.e., the linearity of the amplifier.

Figure 11B:
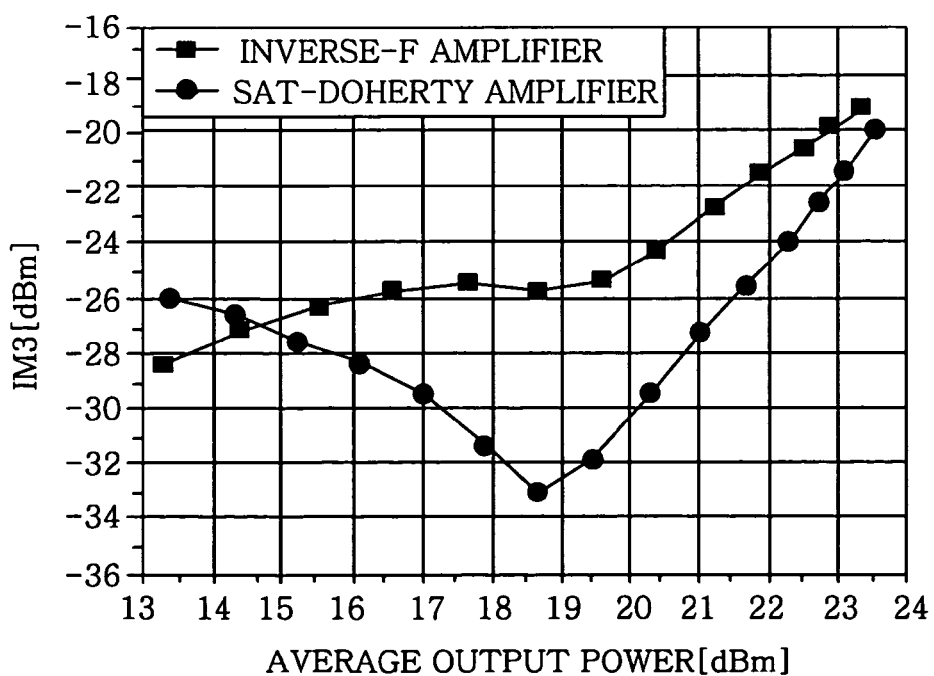
FIG. 11B is a two-tone simulation graph showing the IMD3 levels of the harmonic-controlled Doherty power amplifying apparatus in accordance with the embodiment of the present invention and a conventional inverse-F amplifier.

As shown in FIG. 11A, the IM3 levels have approximately same amplitudes in a high output power range. It is thought that the phases thereof are opposite to each other (i.e., the phase difference is 180°), resulting in a mutual cancellation of IM3. As shown in FIG. 11B, the IMD3 is enhanced due to the cancellation effect, and the power amplifying apparatus of the present invention operates more linearly than the conventional ones by using the harmonic-controlled Doherty power amplifier (designated by "Sat-Doherty Amplifier" in FIG. 11B) in accordance with the present invention instead of the conventional saturation power amplifier (designated by "Inverse-F Amplifier" in FIG. 11B). Further, in addition to the high efficiency as described above, the power amplifying apparatus of the present invention operates more linearly than the switching or saturation power amplifier.

Figure 12:
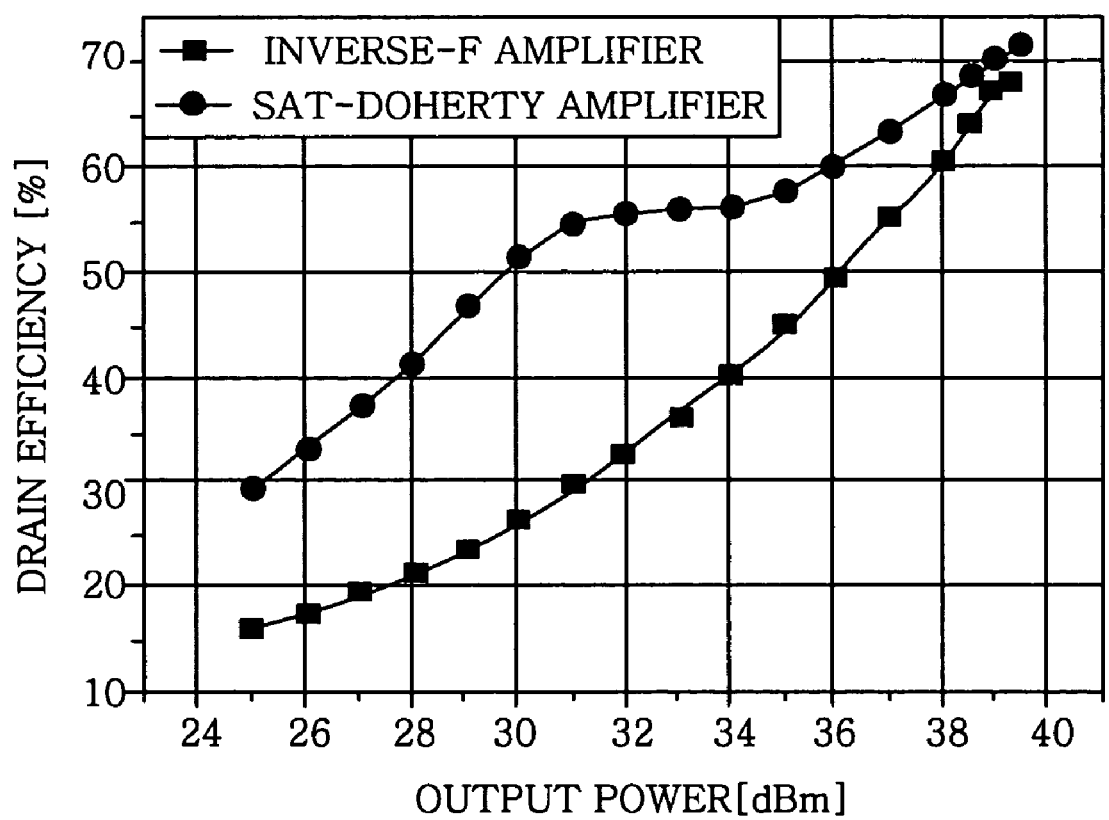
FIG. 12 is a graph showing the drain efficiencies of the harmonic-controlled Doherty power amplifying apparatus in accordance with the embodiment of the present invention and a conventional inverse-F amplifier.

FIG. 12 shows the drain efficiency measured for CW signal to check the high-efficiency characteristics of the Doherty power amplifying apparatus of the present invention implemented as an inverse class-F type using two MRF281_devices manufactured by Frescale. As can be seen therefrom, the Doherty power amplifier (designated by "Sat-Doherty Amplifier" in FIG. 12) in accordance with the present invention has a higher efficiency than the conventional high-efficiency power amplifier (designated by "Inverse-F Amplifier" in FIG. 12) for overall output power range. Further, the harmonic-controlled Doherty power amplifier of the present invention shows en efficiency of 55% at the average output power (i.e., at the output power level of 31 dBm) that is conventionally regarded as important, which is higher by 25% than the conventional case.

Figure 13A:
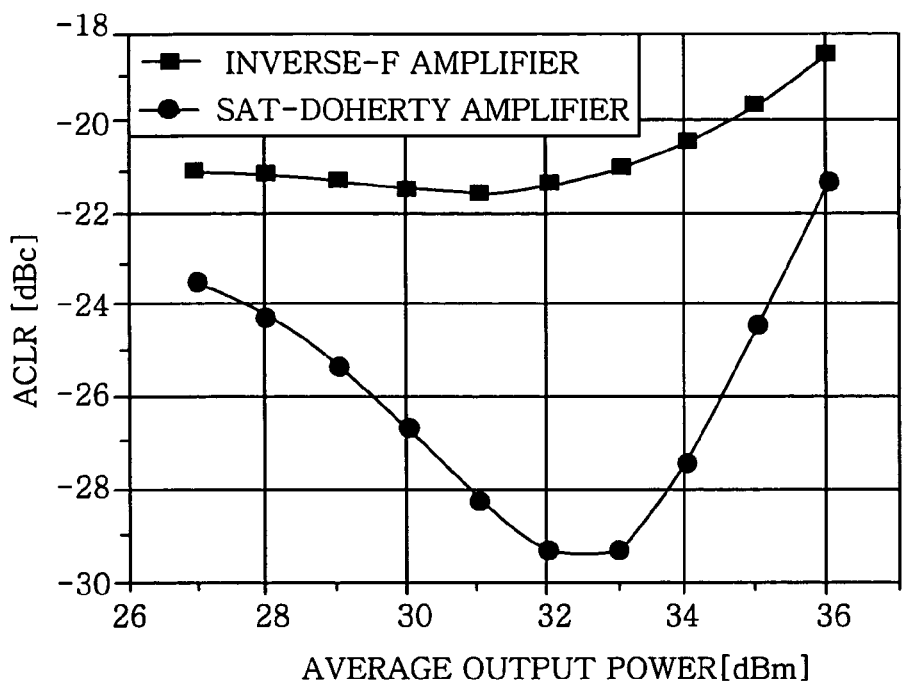
FIG. 13A is a graph showing the ACLRs of the harmonic-controlled Doherty power amplifying apparatus with respect to WCDMA signal in accordance with the embodiment of the present invention and a conventional inverse-F amplifier.

FIG. 13A describes a graph showing an experiment result performed on the harmonic-controlled Doherty amplifier of the present invention by applying WCDMA signals so as to investigate the adjacent channel leakage ratio (ACLR), which indicates the linearity, in terms of average output power. The ACLR denotes that a signal having a spectrum such as CDMA is compared using marker-to-marker on the spectrum between its own channel and an adjacent channel away from a frequency domain by a random offset. In other words, the ACLR indicates a value obtained by subtracting a marker of its own channel from another channel. The spectrum of the adjacent channel is generated by nonlinear characteristics of the amplifier. And also, ACLR is used for an index representing the linearity of the amplifier.

As shown in FIG. 13A, the harmonic-controlled amplifier (designated by "Sat-Doherty Amplifier" in FIG. 13A) has a better linearity for overall output power range than the conventional power amplifier (designated by "Inverse-F Amplifier" in FIG. 13A).

Figure 13B:
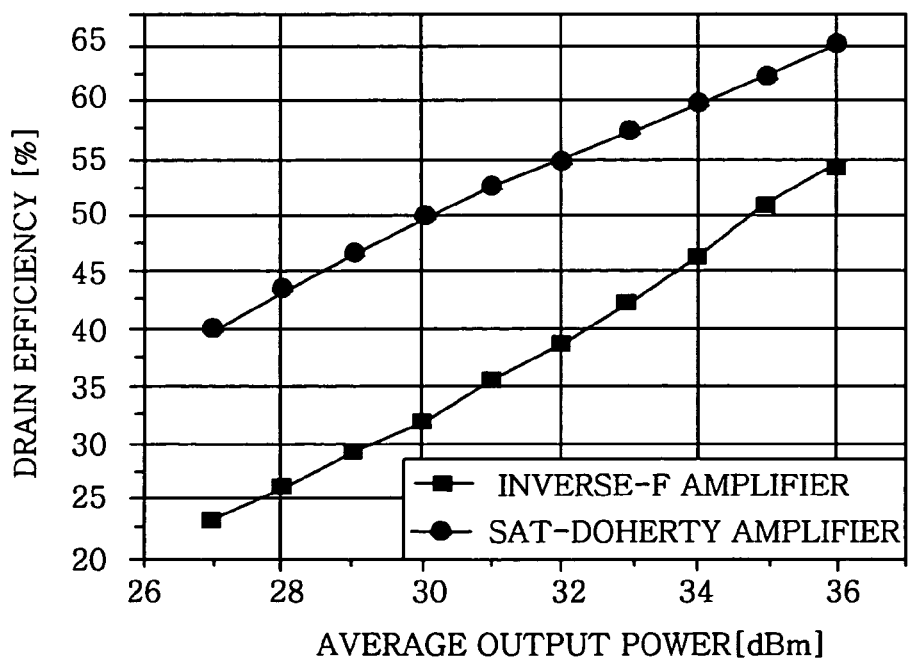
FIG. 13B is a graph showing the drain efficiencies of the harmonic-controlled Doherty power amplifying apparatus with respect to WCDMA signal in accordance with the embodiment of the present invention and a conventional inverse-F amplifier.

FIG. 13B is a graph showing the drain efficiencies of the harmonic-controlled Doherty power amplifying apparatus with respect to WCDMA signal in accordance with the embodiment of the present invention and a conventional inverse-F amplifier.

FIG. 13B is a graph showing an experiment result performed on the harmonic-controlled Doherty amplifier (designated by "Sat-Doherty Amplifier" in FIG. 13B) of the present invention by applying WCDMA signals so as to measure the drain efficiency in terms of average output power. As can be seen therefrom, the high efficiency characteristics can be achieved for the modulated signal as well.

Further, the devices used for the harmonic-controlled carrier amplifier and the harmonic-controlled peaking amplifier having the harmonic control circuit in accordance with the present invention may be MOS or BJT devices. However, since the circuit connections and operations thereof are well known for those skilled in the art, detailed description thereof will be omitted.

As discussed above, in accordance with the present invention, the efficiency can be enhanced compared to the conventional Doherty amplifier and other kinds of power amplifiers, the improved Doherty amplifier using the harmonic control circuit of a simple configuration is constructed to attain a better linearity, while achieving a higher performance.

While the invention has been shown and described with respect to the embodiments, it will be understood by those skilled in the art that various changes and modification may be made without departing from the scope of the invention as defined in the following claims.

What is claimed is:

1. A Doherty power amplifying apparatus, comprising:
   a harmonic-controlled Doherty amplifier;
   an input matching unit and an output matching unit for input matching and output matching the harmonic-controlled Doherty amplifier, respectively; and
   an offset line, connected to an output end of the Doherty amplifier, for controlling an output of a load impedance of the Doherty amplifier when the peaking amplifier is not operating,
   wherein the harmonic-controlled Doherty amplifier includes:
   a carrier amplifier;
   a peaking amplifier arranged in parallel to the carrier amplifier; and
   a harmonic control circuit, arranged in front of the output matching unit, for controlling a harmonic component of an output of the Doherty amplifier to enable the Doherty amplifier to perform a switching or saturation operation.

2. The Doherty power amplifying apparatus of claim 1, further comprising:
   a quarter-wave transmission line serving as an impedance inverter for performing a ¼ wavelength conversion to enable a Doherty power amplification.

3. The Doherty power amplifying apparatus of claim 1, further comprising:
   a quarter-wave transmission line for performing a ¼ wavelength conversion to set a load impedance of the Doherty power amplifying apparatus.

4. The Doherty power amplifying apparatus of claim 1, further comprising:
   a transmission line shorter or longer than a ¼ wavelength; and
   a passive element,
   wherein the transmission line and the passive element are disposed in a manner to enable a Doherty amplification.

5. The Doherty power amplifying apparatus of claim 1, further comprising:
   an impedance inverter for enabling a Doherty power amplification.

6. The Doherty power amplifying apparatus of claim 1, wherein the peaking amplifier is off and the carrier amplifier is on in a lower power range, and the peaking amplifier and the carrier amplifier are on in a higher power range.

7. A Doherty power amplifier, comprising:
   a carrier amplifier and a plurality of peaking amplifiers, each of the carrier amplifier and the peaking amplifiers includes an input matching unit and an output matching unit;
   a N-way power divider for applying a same input power to the carrier amplifier and the peaking amplifiers;
   an offset line, connected to each of the output matching units of the carrier amplifier and the peaking amplifiers, for controlling a load impedance output when the peaking amplifiers are not operating;
   a first quarter-wave transmission line serving as an impedance inverter for converting an impedance output provided by the offset line into a ¼ wavelength to enable a Doherty amplification;
   a second quarter-wave transmission line for converting an impedance output provided by the offset line into a ¼ wavelength to set a load impedance of the Doherty amplifier; and
   a harmonic control circuit for controlling a harmonic component in an output of the carrier amplifier and the peaking amplifiers to enable the Doherty amplifier to perform a switching or saturation operation.

8. A Doherty power amplifier, comprising:
   a carrier amplifier and a plurality of peaking amplifiers, each of the carrier amplifier and the peaking amplifiers includes an input matching unit and an output matching unit;
   a N-stage power divider for applying a same input power to the carrier amplifier and the peaking amplifiers;
   an offset line, connected to each of the output matching units of the carrier amplifier and the peaking amplifiers, for controlling a load impedance output when the peaking amplifiers are not operating;
   a first quarter-wave transmission line serving as an impedance inverter for converting an impedance output provided by the offset line into a ¼ wavelength to enable a Doherty amplification;
   a second quarter-wave transmission line for converting an impedance output provided by the offset line into a ¼ wavelength to set a load impedance of the Doherty amplifier; and
   a harmonic control circuit for controlling a harmonic component in an output of the carrier amplifier and the peaking amplifiers to enable the Doherty amplifier to perform a switching or saturation operation.

9. The Doherty power amplifying apparatus of claim 1, wherein the harmonic control circuit includes a microstrip line or a passive element for controlling a second or higher harmonic component.

10. The Doherty power amplifying apparatus of claim 1, wherein the Doherty power amplifier is of the type selected from the group consisting of class D, class E, class F, class G, class H, class I, class J, class S, class E/F series (e.g., class $E/F_3$, class $E/F_{2,5}$, class $E/F_{odd}$, class $E/F_{3,odd}$), class J/E, inverse class D and inverse class F.

11. The Doherty power amplifying apparatus of claim 1, wherein the carrier amplifier and the peaking amplifiers are arranged such that nonlinear characteristics therebetween are canceled.

12. The Doherty power amplifier of claim 7, wherein the harmonic control circuit is arranged in front of each of the output matching units of the carrier amplifier and the peaking amplifiers, thereby enabling each of the carrier amplifier and the peaking amplifiers to perform a switching or saturation operation.

13. The Doherty power amplifying apparatus of claim 7, wherein the harmonic control circuit includes a microstrip line or a passive element for controlling a second or higher harmonic component.

14. The Doherty power amplifying apparatus of claim 7, wherein the Doherty power amplifier is of the type selected from the group consisting of class D, class E, class F, class G, class H, class I, class J, class S, class E/F series (e.g., class $E/F_3$, class $E/F_{2,5}$, class $E/F_{odd}$, class $E/F_{3,odd}$), class J/E, inverse class D and inverse class F.

15. The Doherty power amplifying apparatus of claim 7, wherein the carrier amplifier and the peaking amplifiers are arranged such that nonlinear characteristics therebetween are canceled.

16. The Doherty power amplifying apparatus of claim 8, wherein the harmonic control circuit includes a microstrip line or a passive element for controlling a second or higher harmonic component.

17. The Doherty power amplifying apparatus of claim 8, wherein the Doherty power amplifier is of the type selected from the group consisting of class D, class E, class F, class G, class H, class I, class J, class S, class E/F series (e.g., class $E/F_3$, class $E/F_{2,5}$, class $E/F_{odd}$, class $E/F_{3,odd}$), class J/E, inverse class D and inverse class F.

18. The Doherty power amplifying apparatus of claim 8, wherein the carrier amplifier and the peaking amplifiers are arranged such that nonlinear characteristics therebetween are canceled.

19. The Doherty power amplifier of claim 8, wherein the harmonic control circuit is arranged in front of each of the output matching units of the carrier amplifier and the peaking amplifiers, thereby enabling each of the carrier amplifier and the peaking amplifiers to perform a switching or saturation operation.

* * * * *